(12) United States Patent
Liu

(10) Patent No.: US 7,492,852 B1
(45) Date of Patent: Feb. 17, 2009

(54) FRACTIONAL FREQUENCY DIVIDER

(75) Inventor: Sen-You Liu, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 11/868,496

(22) Filed: Oct. 7, 2007

(30) Foreign Application Priority Data

Sep. 12, 2007 (TW) ............... 96134062 A (51) Int. Cl.
H03K 21/00 (2006.01)
(52) U.S. Cl. ..................................... 377/48; 327/115
(58) Field of Classification Search ............... None
See application file for complete search history.

(56) References Cited

U.S. PATENT DOCUMENTS

| | | | |
|---|---|---|---|
| 5,729,179 A | 3/1998 | Sumi | |
| 6,822,491 B1 * | 11/2004 | Glass | 327/115 |
| 6,895,061 B1 * | 5/2005 | Stong | 375/354 |
| 7,102,399 B2 * | 9/2006 | Wu | 327/156 |
| 7,113,009 B2 * | 9/2006 | Sun et al. | 327/115 |
| 7,180,339 B2 * | 2/2007 | Lanier | 327/115 |
| 7,187,217 B2 * | 3/2007 | Marutani | 327/117 |
| 2005/0035794 A1 * | 2/2005 | Tam et al. | 327/115 |
| 2005/0174153 A1 * | 8/2005 | Saeki | 327/117 |
| 2005/0212570 A1 * | 9/2005 | Sun et al. | 327/115 |
| 2005/0258879 A1 * | 11/2005 | Marutani | 327/117 |
| 2007/0147571 A1 | 6/2007 | Yu et al. | |

* cited by examiner

Primary Examiner—Cassandra Cox
(74) Attorney, Agent, or Firm—Nixon Peabody LLP (57) ABSTRACT

A divide-by-N/(N+0.5) frequency divider is disclosed. Two pairs of flip-flops are respectively triggered by an input clock and an inverted input clock, and a frequency-dividing selector is used to select one output of the two pairs of flip-flops as frequency-divided output signal. Two latches are respectively triggered by the input clock and the inverted input clock, and a modulus selector is used to select one output of the two latches. A modulus logic circuit determines being in either N frequency-dividing mode or (N+0.5) frequency-dividing mode based on a modulus control signal. A frequency-dividing logic circuit receives output of the modulus logic circuit and an inverted frequency-divided output signal to swallow half the input clock per output cycle in the (N+0.5) frequency-dividing mode, therefore obtaining division resolution of half the input clock.

16 Claims, 11 Drawing Sheets

FRACTIONAL FREQUENCY DIVIDER

BACKGROUND OF THE INVENTION

1. Field of the Invention

The present invention generally relates to a frequency divider, and more particularly to a dual-modulus divide-by-N/(N+0.5) frequency divider adaptable for a phase locked loop (PLL).

2. Description of the Prior Art

Figure 1:
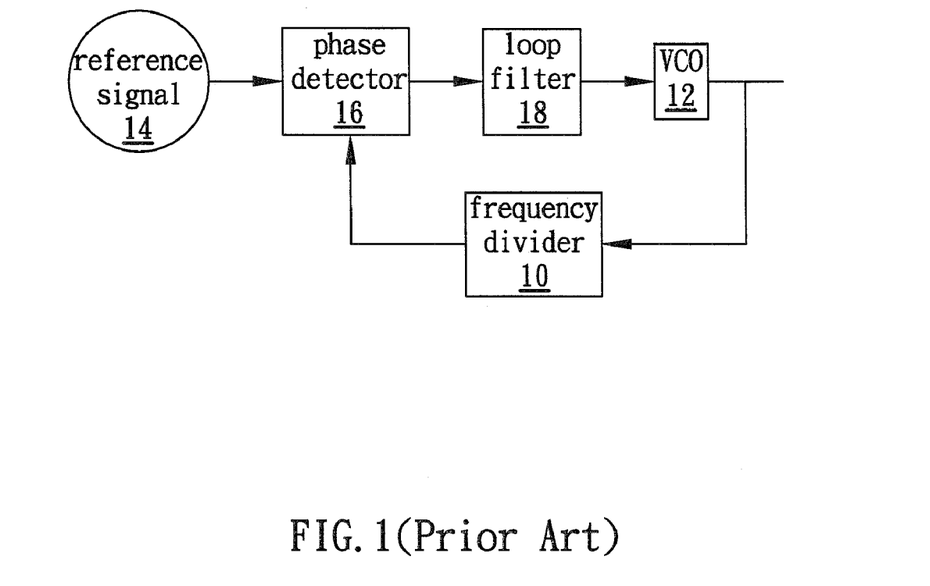
FIG. 1 shows a block diagram of the PLL.

Phase locked loop (PLL) is widely utilized in integrated circuits or systems, such as communication systems, to synchronize the clocks of a receiver. FIG. 1 shows a block diagram of the PLL. A frequency divider 10 divides (or decreases) the frequency of the output signal of a voltage controlled oscillator (VCO) 12. The frequency-divided signal and a reference signal 14 are fed to a phase detector 16 to detect their phase difference. The detected difference signal passes through a loop filter 18 to have its noise filtered out, and then controls the frequency of the output signal of the VCO 12.

Figure 2:
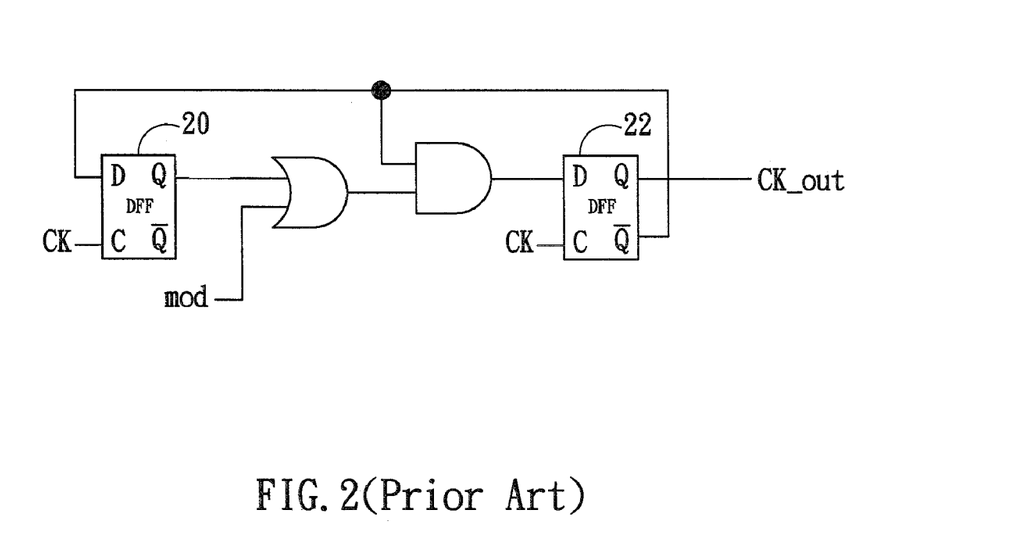
FIG. 2 shows a conventional dual-modulus divide-by-N/(N+1) frequency divider.

The frequency divider 10 forms a negative feedback loop in the PLL of FIG. 1 to lock the VCO 12 at a multiple of the reference frequency 14. In modern communication systems, the frequency divider 10 is further required to be capable of locking the VCO 12 at and switching among various frequencies, realizing a frequency synthesizer. FIG. 2 shows a conventional dual-modulus divide-by-N/(N+1) frequency divider, which could divide the frequency of an input clock by a factor N or N+1, N being an integer. This type of frequency divider, accordingly, is commonly named an integer frequency divider. Here is an exemplary divide-by-2/3 frequency divider using a D-type flip-flop (DFF) 20 for division by 2, and another D-type flip-flop (DFF) 22 for division by 3.

Figure 3:
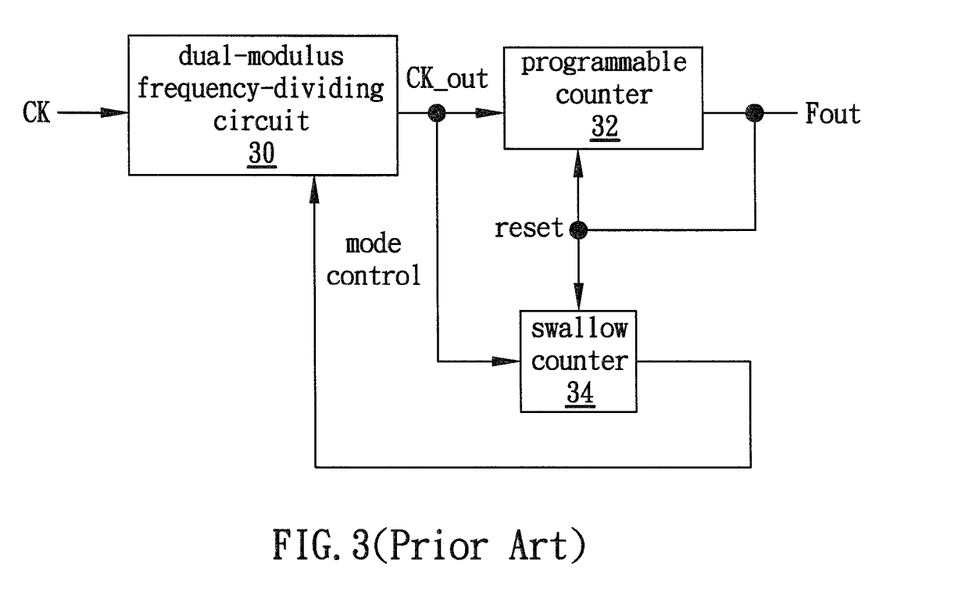
FIG. 3 shows a conventional dual-modulus divide-by-N/(N+1) frequency divider adaptable for the PLL.

FIG. 3 shows a conventional dual-modulus divide-by-N/(N+1) frequency divider adaptable for the PLL. This frequency divider includes a dual-modulus frequency-dividing circuit 30, a programmable counter 32, and a swallow counter 34. Assume the count set value of the programmable counter 32 is P, and the count set value of the swallow counter 34 is S. The swallow counter 34 counts S times of periods with division ratio of (N+1), and the programmable counter 32 subsequently counts (P−S) times of periods with division ratio of N. Accordingly, the total number of input pulses during an entire cycle of the programmable counter 32 and the swallow counter 34 are expressed as follows:

$$(N+1)\cdot S+N\cdot(P-S)=P\cdot N+S \quad (1)$$

The integer frequency divider discussed above is not sufficient for modern complex communication systems, such as wireless communication systems. For example, as the channel spacing has 200 kHz (such as in the GSM system), the reference frequency 14 (FIG. 1) should be no more than 200 kHz; and, as a rule of thumb, the bandwidth of the loop filter 18 should be no larger than one tenth of the reference frequency 14 for the stability issue. Nevertheless, a larger bandwidth of the loop filter 14 implies a faster locking time; and, furthermore, the noise due to the VCO 12 could be minimized by having the bandwidth of the loop filter 18 as wide as possible.

Figure 4A:
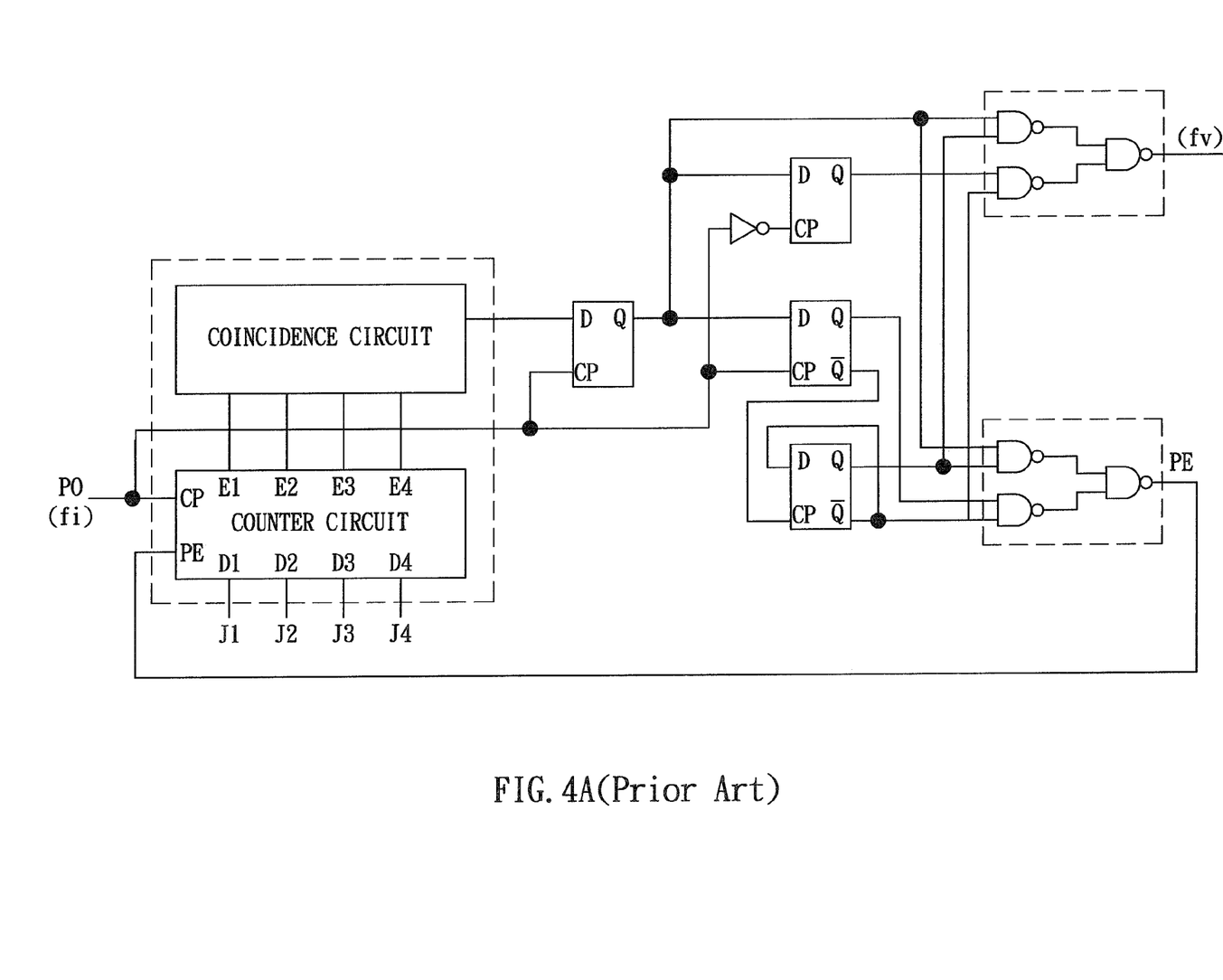
FIGS. 4A-4B show conventional fractional frequency dividers.

With respect to the above constraints, some non-integer or fractional frequency dividers are accordingly proposed. For example, a fractional frequency divider (FIG. 4A) is disclosed in U.S. Pat. No. 5,729,179, which uses COUNTER and COINCIDENCE CIRCUIT, resulting in a circuit that is complicated, high-cost, and area consuming. Another factional frequency divider (FIG. 4B) is disclosed in US Patent Publication No. 2007/0147571, which uses four level-triggered latches to make up a 1/1.5 frequency divider. As the signal out of this frequency divider receives no substantial reduction in frequency (with division ratio of 1 or 1.5), succeeding (integer) frequency divider or dividers with high division ratio are thus required.

For the reasons discussed above, a need has arisen to propose a novel dual-modulus divide-by-N/(N+0.5) frequency divider, which is capable of performing either integer frequency division or fractional frequency division. Moreover, a programmable divide-by-N/(N+0.5) frequency divider is needed for dynamically changing the value of N to be adaptable for modern complex communication systems.

SUMMARY OF THE INVENTION

In view of the foregoing, the present invention provides a frequency divider for performing either integer frequency division or fractional frequency division. Further, the present invention provides a programmable divide-by-N/(N+0.5) frequency divider for dynamically changing the value of N.

According to one embodiment, the present invention provides a divide-by-N/(N+0.5) frequency divider. Two pairs of flip-flops are respectively triggered by an input clock and an inverted input clock, and a frequency-dividing selector is used to select one output of the two pairs of flip-flops as frequency-divided output signal. Two latches are respectively triggered by the input clock and the inverted input clock, and a modulus selector is used to select one output of the two latches. A modulus logic circuit determines being in either N frequency-dividing mode or (N+0.5) frequency-dividing mode based on a modulus control signal. A frequency-dividing logic circuit receives output of the modulus logic circuit and an inverted frequency-divided output signal to swallow half the input clock per output cycle in the (N+0.5) frequency-dividing mode, therefore obtaining division resolution of half the input clock.

DETAILED DESCRIPTION OF THE INVENTION

Figure 5:
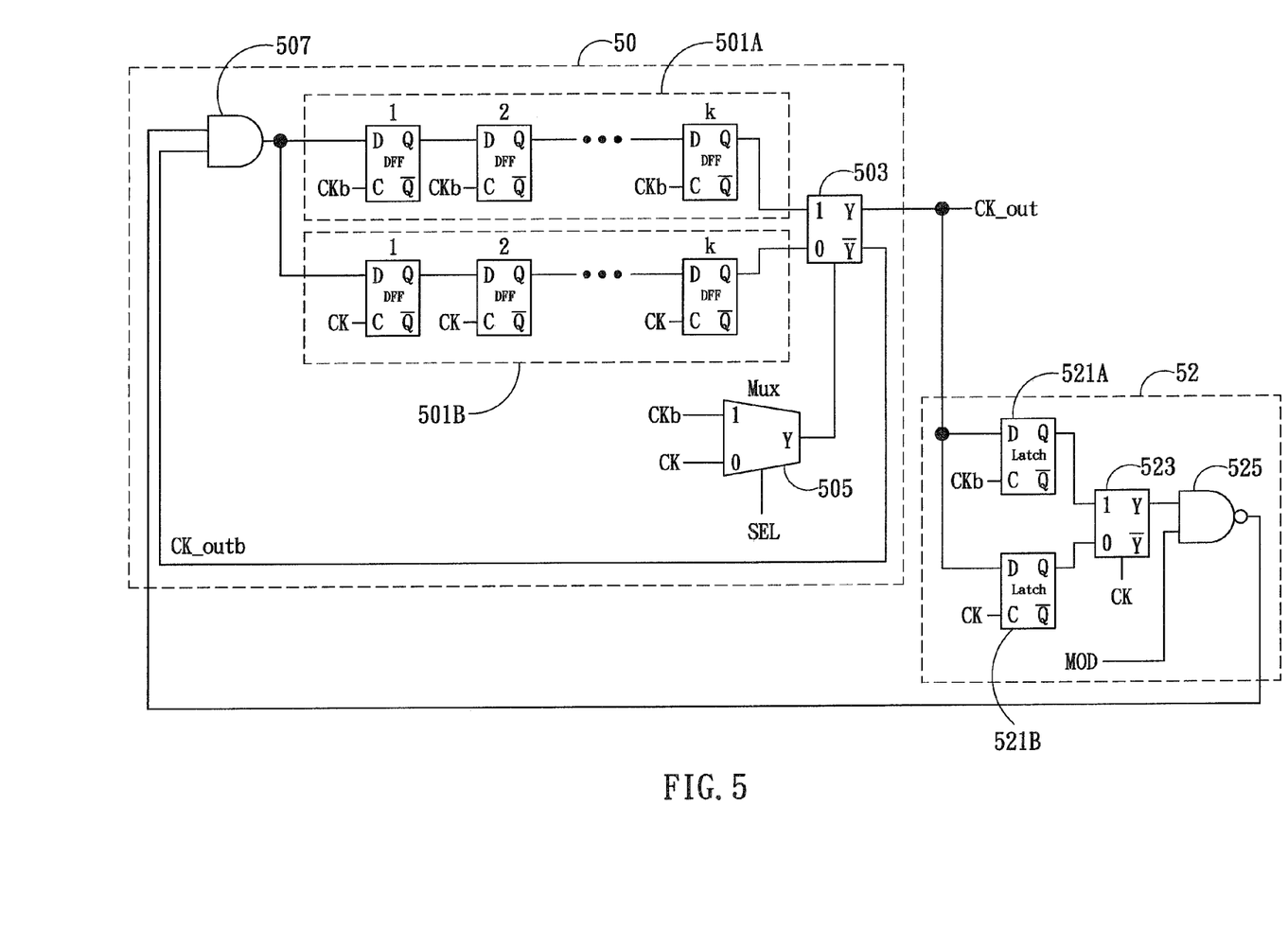
FIG. 5 illustrates a dual-modulus frequency divider according to one embodiment of the present invention.

FIG. 5 illustrates a dual-modulus frequency divider according to one embodiment of the present invention adaptable for (but not limited to) a phase locked loop (PLL) to perform as either an integer frequency divider or a fractional frequency divider, or equivalently a divide-by-N/(N+0.5) frequency divider.

The frequency divider of FIG. 5 primarily includes a frequency-dividing circuit 50 and a switching-control circuit 52. The frequency-dividing circuit 50 includes two pairs (or paths) of flip-flops—the first pair of flip-flops 501A and the second pair of flip-flops 501B. D-type flip-flops (DFF) are used in this embodiment. There may be one or more stages (such as k stages in this embodiment) of flip-flops in each pair of flip-flops 501A and 501B. In the embodiment, the flip-flops 1 through k are "directly" connected, which means in this specification that the neighboring flop-flops are electrically coupled by conductive wire, and the output Q of the preceding one is directly coupled to the input D of the succeeding one.

The pair of flip-flops 501B is triggered by input clock CK, and the other pair of flip-flops 501A is triggered by inverted input clock CKb, which is the inverted one of the input clock CK. In the embodiment, the two pairs of flip-flops 501A and 501B are edge triggered. The frequency divider of the embodiment is thus triggered both at the rising edge and the falling edge of the input clock CK through the pairs of flip-flops 501A and 501B, and therefore the frequency divider has division resolution of half (0.5) input clock CK.

The last outputs Q of the pairs of flip-flops 501A and 501B are connected respectively to a first input "1" and a second input "0" of a frequency-dividing selector 503. In the present embodiment, for example, when a select signal of the frequency-dividing selector 503 is logic "1", the output Q of the pair of flip-flops 501A is chosen as the frequency-divided output signal CK_out, otherwise the output Q of the pair of flip-flops 501B is chosen as the frequency-divided output signal CK_out. The frequency-dividing selector 503 could be implemented, for example, by a multiplexer.

For the divide-by-N/(N+0.5) frequency divider of the embodiment, the value of N may be either odd integer or even integer, which is determined by an odd/even selector 505—the input clock CK is selected for controlling the frequency-dividing selector 503 to realize N/(N+0.5) frequency division with even integer N when the select signal SEL is logic "0"; otherwise the inverted input clock CKb is selected for controlling the frequency-dividing selector 503 to realize N/(N+0.5) frequency division with odd integer N when the select signal SEL is logic "1". The odd/even selector 505 could be implemented, for example, by a multiplexer Mux. The number k of total stages of each pair of flip-flops (501A or 501B) and the select signal SEL of the odd/even selector 505 have following relationship:

$$N/(N+0.5)=(2 \cdot k-1 \cdot SEL)/(2 \cdot k-1 \cdot SEL+0.5) \quad (2)$$

For example, 4/4.5 frequency division is realized, when the select signal is logic "0" and the number k of total stages of each pair of flip-flops is 2.

The switching between integer frequency division and fractional frequency division is determined by the switching-control circuit 52 in accordance with a modulus control signal MOD. The switching-control circuit 52 includes two latches 521A and 521B, which are triggered respectively by the input clock CK and the inverted input clock CKb. The latches 521A and 521B are implemented by D-type latches in this embodiment. In the embodiment, the latches 521A and 521B are level triggered. The outputs Q of the latches 521A and 521B are connected respectively to a first input "1" and a second input "0" of a modulus selector 523. In the present embodiment, for example, when a select signal (i.e., the input clock CK) of the modulus selector 523 is logic "1", the output Q of the latch 521A is chosen as the output of the modulus selector 523 to subsequently control the period of the output signal CK_out, otherwise the output Q of the latch 521B is chosen as the output of the modulus selector 523. The modulus selector 523 could be implemented, for example, by a multiplexer.

The output of the modulus selector 523 and the modulus control signal MOD are fed to a modulus logic circuit 525, which is implemented by a NAND logic gate. The (N+0.5) frequency division is performed when the modulus control signal MOD is logic "1", otherwise the N frequency division is performed.

The frequency-dividing circuit 50 further includes a frequency-dividing logic circuit 507 (which is an AND logic gate in the embodiment) that receives the output of the modulus logic circuit 525 and an inverted (frequency-divided) output signal CK_outb, which is an inverted one of the output signal CK_out. The output of the frequency-dividing logic circuit 507 is utilized to swallow half input clock CK per output cycle (as indicated in 5 of FIG. 6B) in (N+0.5) frequency-dividing mode, therefore obtaining division resolution of half (0.5) input clock CK.

Figure 6A:
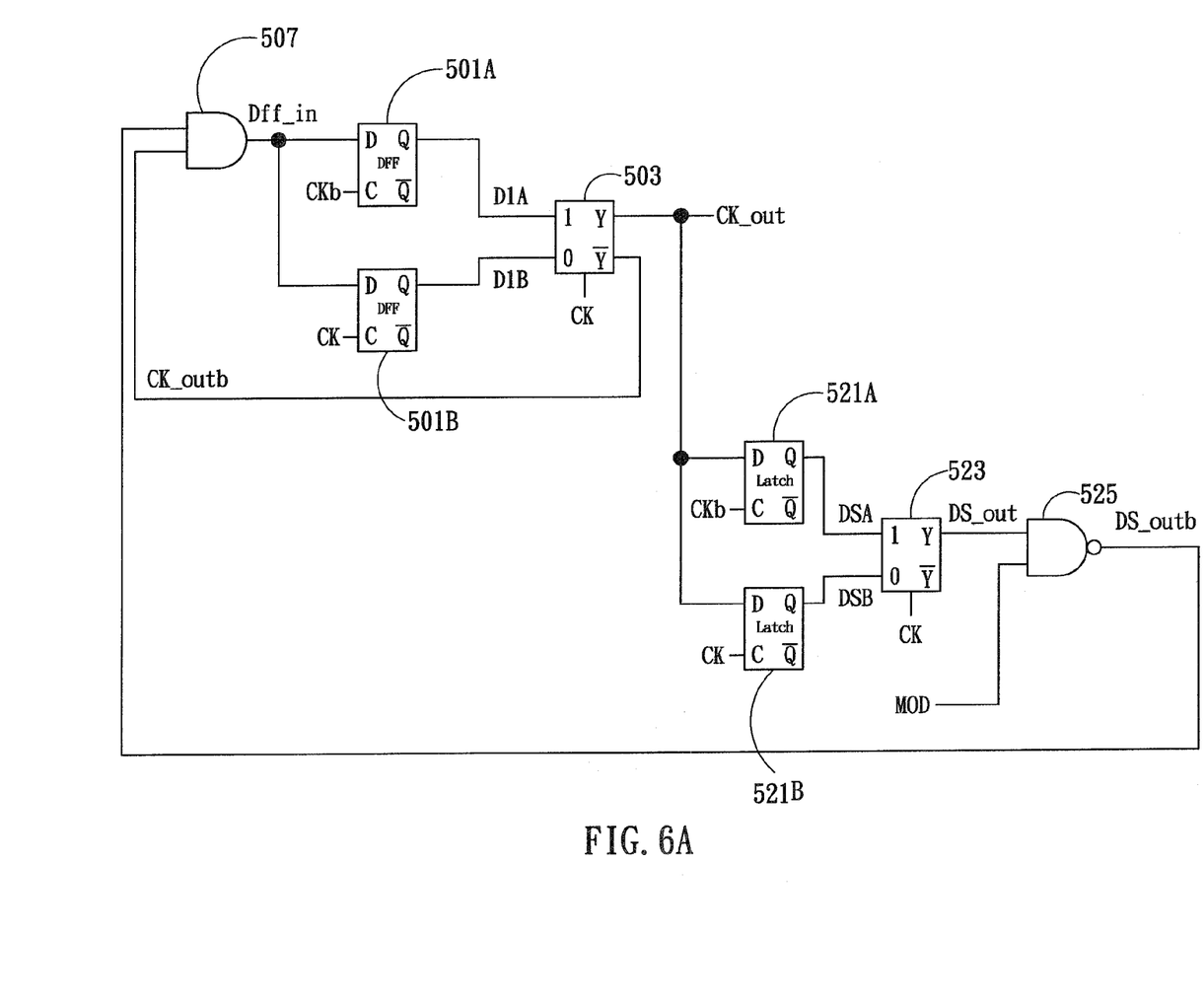
FIG. 6A shows an exemplary divide-by-2/2.5 frequency divider according to the embodiment of FIG. 5.

FIG. 6A shows an exemplary divide-by-2/2.5 frequency divider according to the embodiment of FIG. 5 on a condition that the number k of total stages of flip-flops is 1, the select signal SEL is logic "0" for even N integer (i.e., 2), and the modulus control signal MOD is logic "1" while the odd/even selector 505 is schematically omitted. The circuits or elements having corresponding counterparts in FIG. 5 use the same reference numerals, and their functions are omitted for brevity.

Figure 6B:
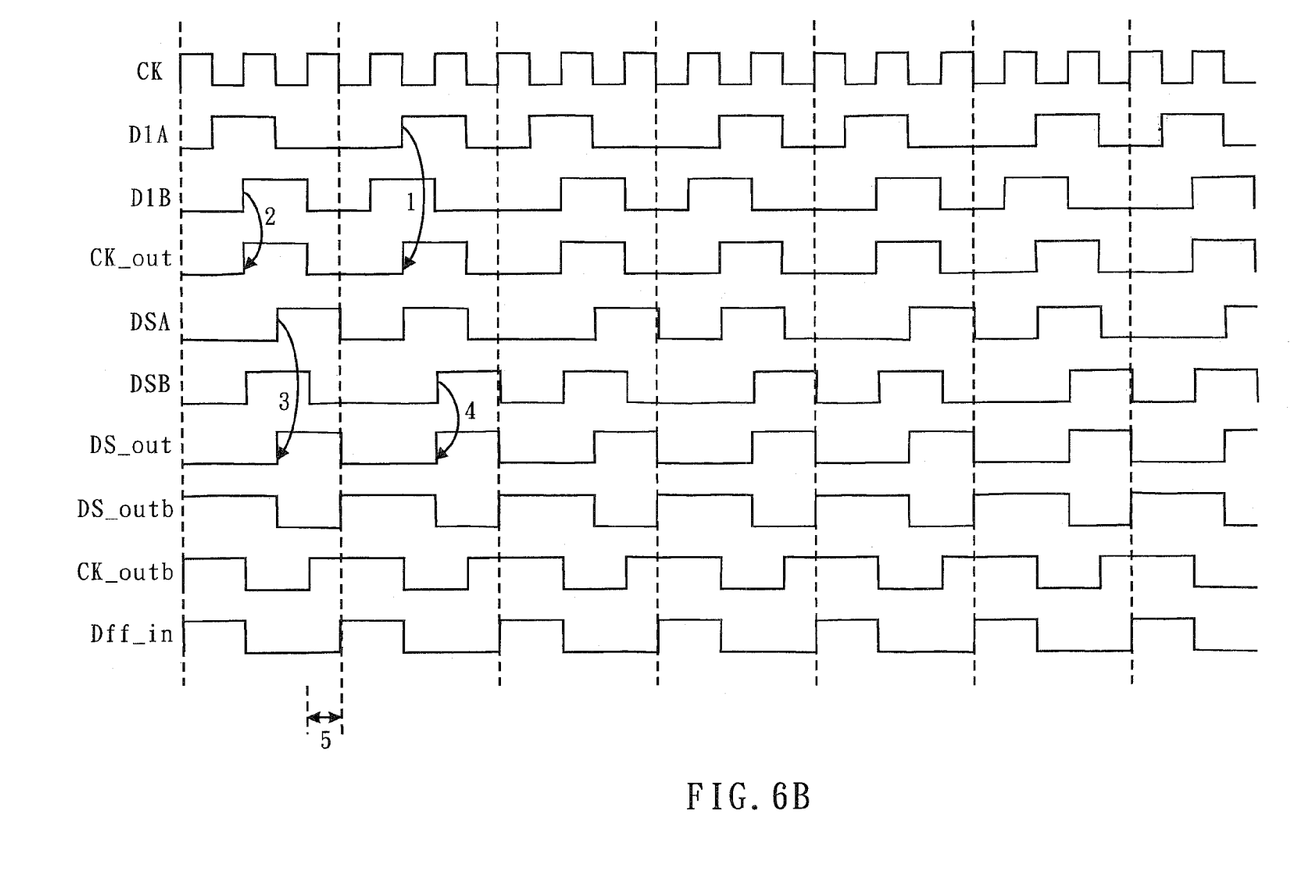
FIG. 6B shows waveforms of various signals in FIG. 6A.

FIG. 6B shows waveforms of various signals in FIG. 6A. The dotted lines across the signals partition the (frequency-divided) output signal CK_out into output cycles. In this case, each output cycle is equal to 2.5 times the input clock CK. The pair of flip-flops 501B is triggered by the input clock CK to generate signal D1B; and the pair of flip-flops 501A is triggered by the inverted input clock CKb to generate signal D1A. As discussed above, when the select signal of the frequency-dividing selector 503 is logic "1", the output D1A of the pair of flip-flops 501A is chosen as the output signal CK_out, otherwise the output D1B of the pair of flip-flops 501B is chosen as the output signal CK_out. Accordingly, the frequency-dividing selector 503 alternately outputs the signal D1A (1, FIG. 6B) and the signal D1B (2, FIG. 6B) per each output cycle.

As discussed above, the latches 521A and 521B are triggered respectively by the input clock CK and the inverted input clock CKb. The outputs DSA and DSB of the latches 521A and 521B are connected respectively to the first input "1" and the second input "0" of the modulus selector 523. When the select signal (i.e., the input clock CK) of the modulus selector 523 is logic "1", the output DSA of the latch 521A is chosen as the output, otherwise the output DSB of the latch 521B is chosen as the output. Similar to the signals D1A and D1B, the modulus selector 523 alternately outputs the signal DSA (3, FIG. 6B) and the signal DSB (4, FIG. 6B) per each output cycle.

The output DS_outb of the modulus logic circuit 525 and the inverted output signal CK_outb are fed to the frequency-dividing logic circuit 507, whose output Dff_in is utilized to swallow half input clock CK per output cycle (as indicated in 5 of FIG. 6B), therefore obtaining division resolution of half (0.5) input clock CK.

Figure 7A:
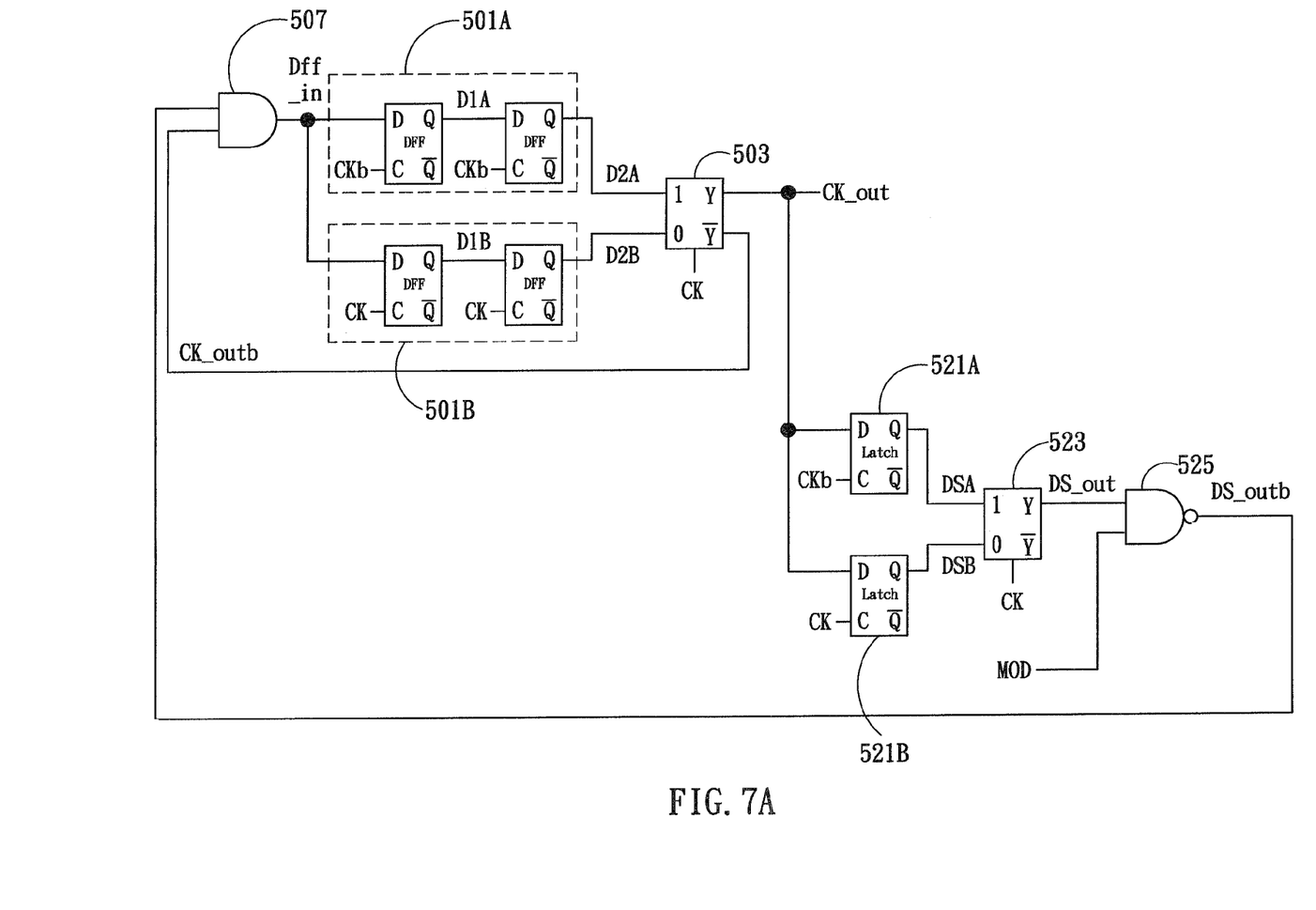
FIG. 7A shows an exemplary divide-by-4/4.5 frequency divider according to the embodiment of FIG. 5.

FIG. 7A shows an exemplary divide-by-4/4.5 frequency divider according to the embodiment of FIG. 5 on a condition that the number k of total stages of flip-flops is 2, the select signal SEL is logic "0" for even N integer (i.e., 4), and the modulus control signal MOD is logic "1" while the odd/even selector 505 is schematically omitted. The circuits or elements having corresponding counterparts in FIG. 5 use the same reference numerals, and their functions are omitted for brevity.

Figure 7B:
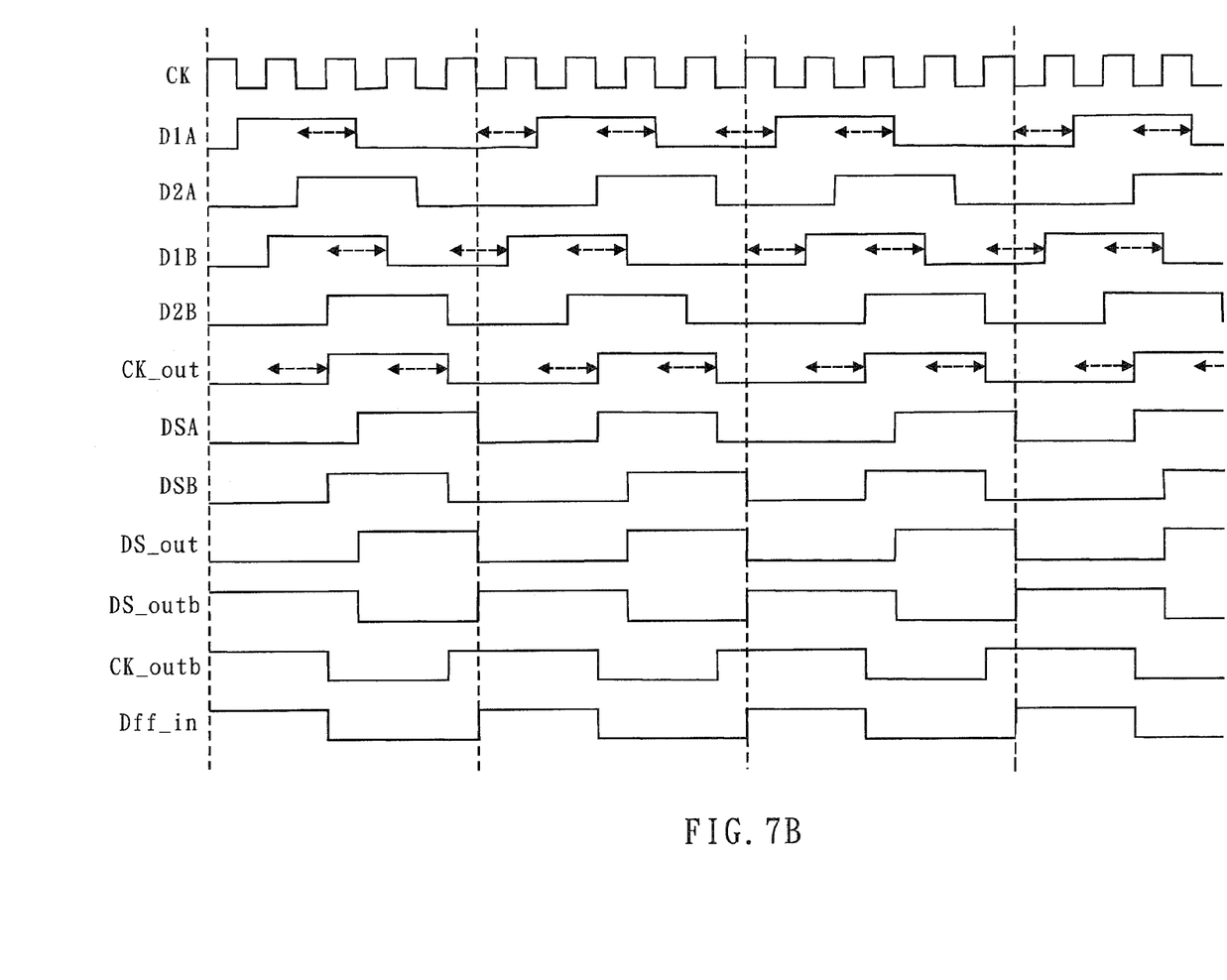
FIG. 7B shows waveforms of various signals in FIG. 7A.

FIG. 7B shows waveforms of various signals in FIG. 7A. The operation associated with FIGS. 7A-7B is similar to that associated with FIGS. 6A-6B, but each output cycle of FIG. 7B is equal to 4.5 times the input clock CK. Moreover, in FIG. 7A, each pair of the flip-flops 501A and 501B includes two cascaded flip-flops. Compared to the divide-by-2/2.5 frequency divider of FIG. 6A, as one more flip-flop is used for each pair, a delay equivalent of one input clock is triggered by the input clock CK and the inverted input clock CKb, thereby generating two more input clock periods per output cycle as indicated by the arrows in FIG. 7B.

Figure 8:
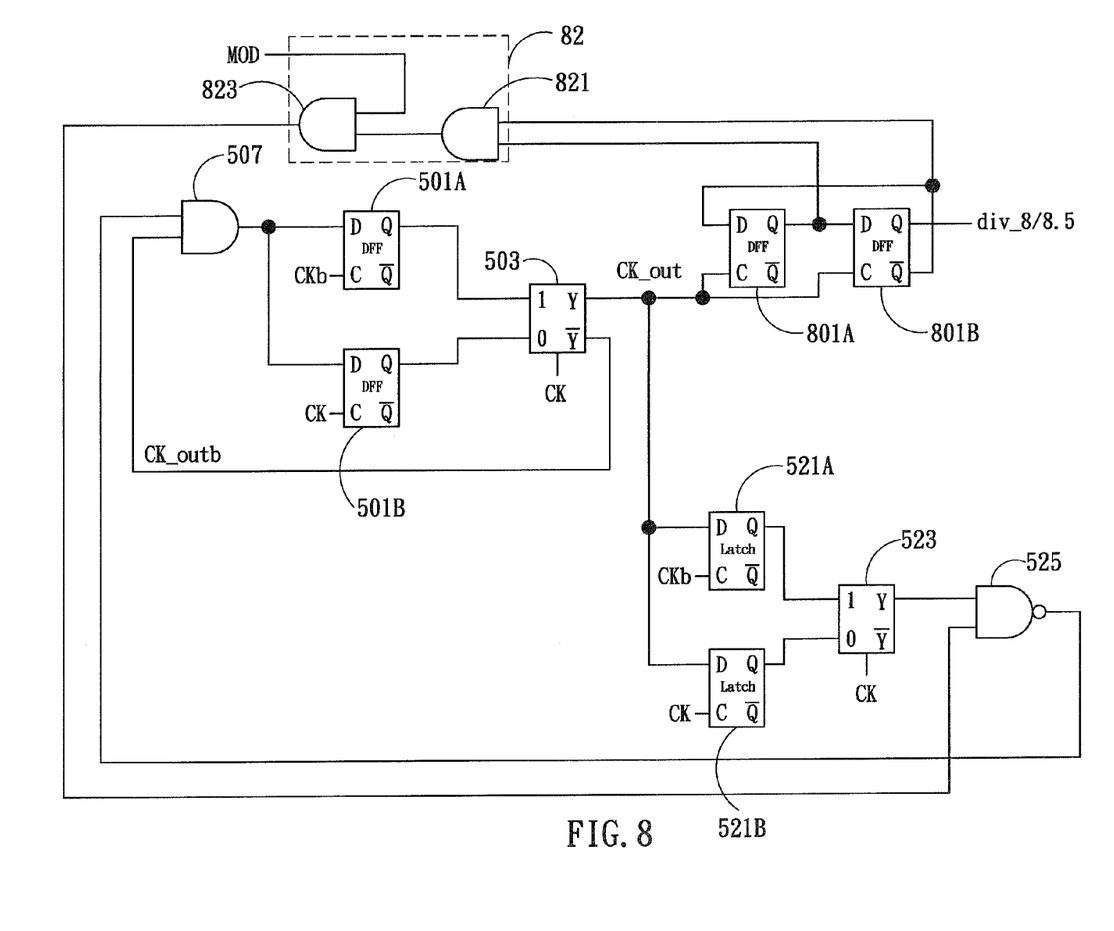
FIG. 8 illustrates a divide-by-8/8.5 frequency divider according to another embodiment of the present invention.

FIG. 8 illustrates a divide-by-8/8.5 frequency divider according to another embodiment of the present invention. The circuits or elements having corresponding counterparts in FIG. 5 use the same reference numerals, and their functions are omitted for brevity. Considering driving capability of the input clock CK and the inverted input clock CKb, especially when the number k of total stages of the flip-flops in the pair 501A or 501B is large, pairs of flip-flops with low k value (such as 1) are used in this embodiment, followed by connecting a low speed frequency divider to arrive at the N/(N+0.5) frequency division. As shown in FIG. 8, the pairs of flip-flops 501A and 501B respectively use one flip-flop, which result in a divide-by-2/2.5 frequency divider. Subsequently, two cascaded stages of low speed frequency-dividing circuits 801A and 801B are connected to the output signal CK_out. In the embodiment, the low speed frequency-dividing circuit 801A or 801B is implemented by a D-type flip-flop. The two cascaded stages of low speed frequency-dividing circuits 801A and 801B constitute a divide-by-4 frequency divider along with the divide-by-2/2.5 frequency divider, altogether resulting in divide-by-8/8.5 frequency divider as required. The term "low speed" in this specification means that the triggering frequency of the frequency-dividing circuit 801A or 801B is slower than that of the pairs of flip-flops 501A and 501B. It is well comprehended that low speed frequency dividers have advantages of simplified circuit design and low cost. It is appreciated that though only one stage of flip-flop is used in the pairs of flip-flops 501A and 501B to constitute the divide-by-2/2.5 frequency divider, while other number of stages of flip-flops could be used generally to constitute a divide-by-N/(N+0.5) frequency divider. Furthermore, though two cascaded low speed frequency-dividing circuits 801A and 801B are used in this embodiment to constitute the divide-by-4 frequency divider, however the number of cascaded stages could be less or greater than two (2). Further, it is not necessary to use synchronous-type triggering as shown (that is, the frequency-dividing circuits 801A and 801B are simultaneously triggered at nodes C); and other asynchronous-type triggering could be used instead.

The output Q of the frequency-dividing circuit 801A and the inverted output Q of the frequency-dividing circuit 801B are fed to a first AND gate 821 of a logic circuit 82. The output of the first AND logic gate 821 is connected to one input node of a second AND logic gate 823. The logic circuit 82 is designed and operated in a manner such that the modulus control signal MOD could pass the second AND logic gate 823, and further to the modulus logic circuit 525.

Figure 9:
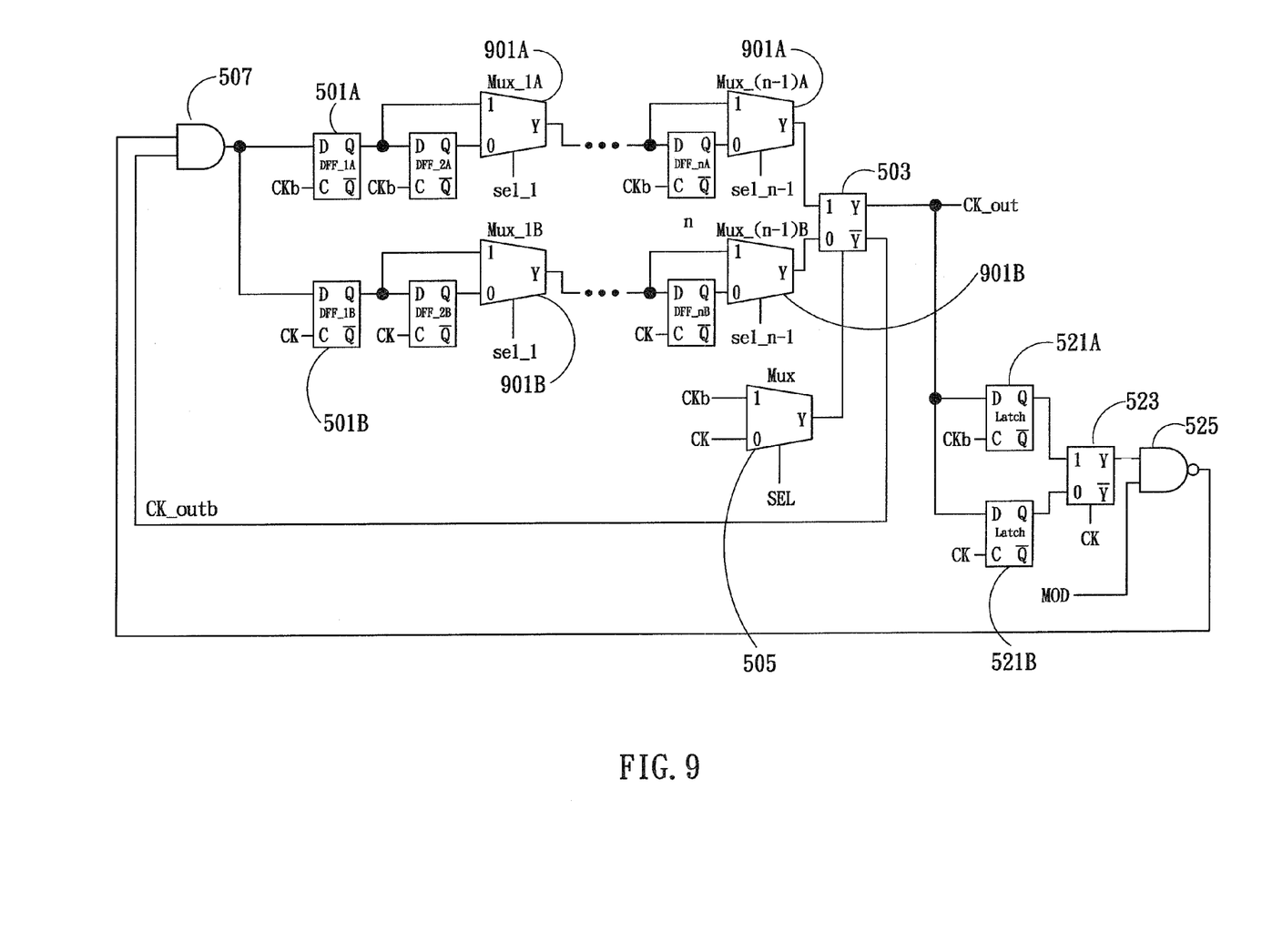
FIG. 9 illustrates a programmable dual-modulus divide-by-N/(N+0.5) frequency divider according to another embodiment of the present invention.

FIG. 9 illustrates a programmable dual-modulus divide-by-N/(N+0.5) frequency divider according to another embodiment of the present invention. The frequency divider of FIG. 9 is not only capable of performing either integer frequency division or fractional frequency division as the frequency divider of FIG. 5, but also capable of dynamically changing the value of N. The circuits or elements having corresponding counterparts in FIG. 5 use the same reference numerals, and their functions are omitted for brevity. Compared to the frequency divider in FIG. 5, the flip-flops of the pairs 501A and 501B in FIG. 9 are not directly connected, but are indirectly connected via programmable selectors 901A and 901B. For example, in the pair of flip-flops 501A, the (n−1)-th programmable selector 901A (Mus_(n−1)A) receives the output Q of the n-th flip-flop (DFF_nA) and the last output of the preceding (n−1) connected flip-flops (that is, the output Q of the (n−1)-th flip-flop); followed by connecting the output Y of the programmable selector 901A to the input D of a next flip-flop. In general, the (n−2)-th programmable selector 901A receives the output Q of the (n−2)-th flip-flop at the input node "1", and receives the output Q of the (n−1)-th flip-flop at the input node "0"; followed by connecting the output Y of the (n−2)-th programmable selector 901A to the input D of the n-th flip-flop. The interconnection in the pair of flip-flops 501B follows the same way. The select signals sel_1, sel_2, . . . , sel_n−1 of the programmable selectors 901A and 901B, the select signal SEL of the odd/even selector 505, the modulus control signal MOD, and the frequency division ratios N/(N+0.5) have relationship as shown in the following table:

| division ratio | sel_1 | sel_2 | ... | sel_n − 1 | SEL | MOD |
|---|---|---|---|---|---|---|
| 1 | 1 | 1 | | 1 | 1 | 0 |
| 1.5 | 1 | 1 | | 1 | 1 | 1 |
| 2 | 0 | 1 | | 1 | 0 | 0 |
| 2.5 | 0 | 1 | | 1 | 0 | 1 |
| ... | | | | | | |
| N | 0 | 0 | | 0 | 1/0 | 0 |
| N + 0.5 | 0 | 0 | | 0 | 1/0 | 1 | where the select signal SEL of the odd/even selector 505 is logic "1" when odd N is required, otherwise the select signal SEL is logic "0" when even N is required; the modulus control signal MOD is logic "0" when integer frequency division is required, otherwise the modulus control signal MOD is logic "1" when fractional frequency division is required.

According to the embodiments discussed above, the frequency divider has division resolution of half (0.5) input clock CK, and the total number of input pulses expressed in (1) is thus modified as follows:

$$(N+0.5) \cdot S + N \cdot (P-S) = P \cdot N + 0.5 \cdot S \quad (3)$$

In a frequency synthesizer, such as sigma-delta fractional-N frequency synthesizer, the quantization step is determined by minimum division resolution. As the embodiment of the present invention is half (0.5) input clock CK, which reduces the quantization step in half, and thus obtains division resolution of 0.5 and lowers the quantization noise power by 6 dB compared the conventional integer frequency divider having division resolution of 1.

Figure 4B:
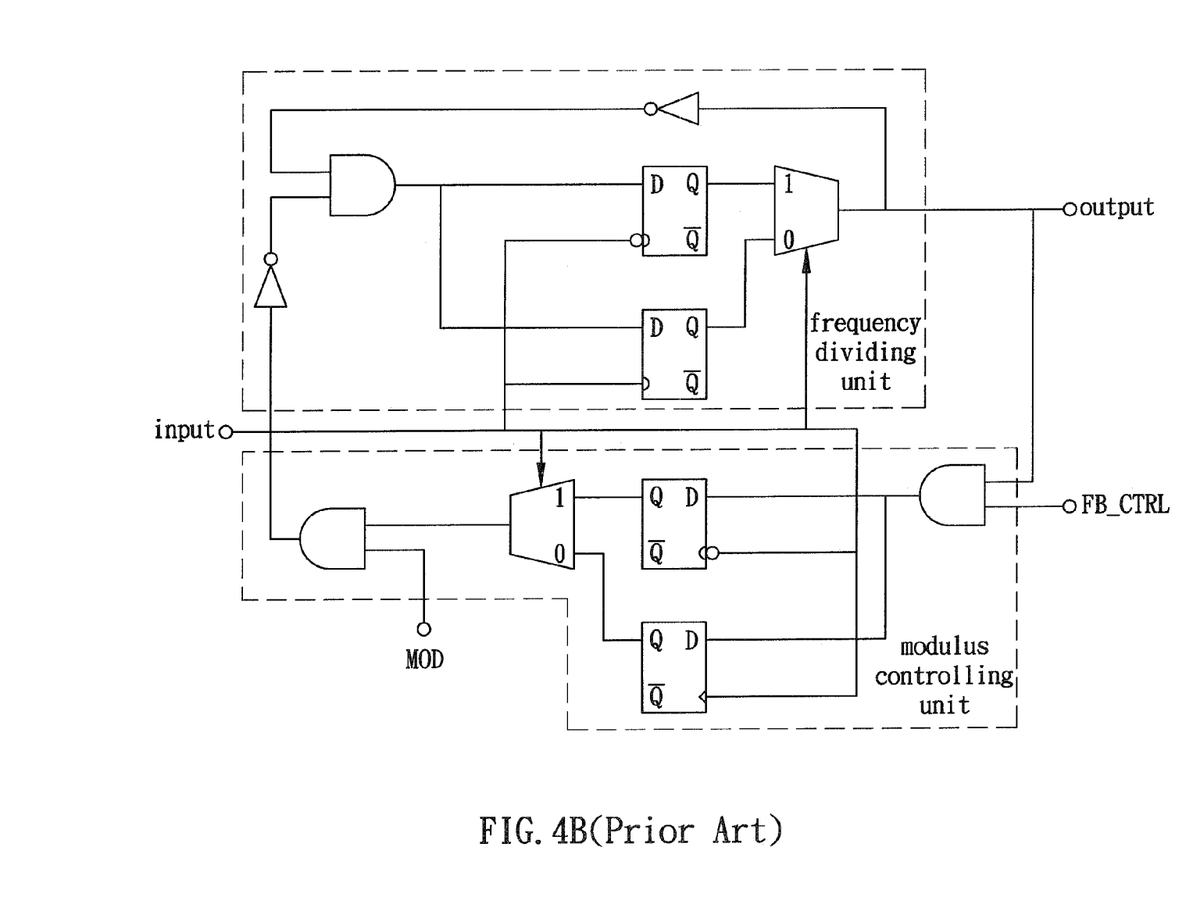

In another aspect, as compared to the conventional fractional frequency divider, such as the frequency divider in FIG. 4B, the divide-by-N/(N+0.5) frequency divider according to the present invention, such as the frequency divider in FIG. 9, is not only capable of substantially decreasing (or reducing) the input frequency with division ratio N greater than 1, but also capable of dynamically programming or changing the division ratio N, thereby selectably widening the division range.

Although specific embodiments have been illustrated and described, it will be appreciated by those skilled in the art that various modifications may be made without departing from the scope of the present invention, which is intended to be limited solely by the appended claims.

What is claimed is:

1. A frequency divider, comprising:
    two pairs of flip-flops respectively triggered by an input clock and an inverted input clock, each said pair having one or a plurality of connected flip-flops;
    a frequency-dividing selector for selecting one output of the two pairs of flip-flops as frequency-divided output signal;
    two latches respectively triggered by the input clock and the inverted input clock;
    a modulus selector for selecting one output of the two latches;
    a modulus logic circuit for determining being in either N frequency-dividing mode or (N+0.5) frequency-dividing mode based on a modulus control signal, N being an integer;
    a frequency-dividing logic circuit for receiving output of the modulus logic circuit and an inverted frequency-divided output signal, said frequency-dividing logic circuit swallowing half the input clock per output cycle of the frequency-divided output signal in the (N+0.5) frequency-dividing mode, therefore obtaining division resolution of half the input clock, and
    an odd/even selector for selecting either the input clock or the inverted input clock to control the frequency-dividing selector.

2. The frequency divider according to claim 1, wherein the two pairs of flip-flops comprises a first pair of flip-flops and a second pair of flip-flops, wherein the first pair of flip-flops is triggered by the inverted input clock, and the second pair of flip-flops is triggered by the input clock.

3. The frequency divider according to claim 2, wherein the flip-flops of each said pair of flip-flops are directly connected by electrically coupling neighboring flip-flops.

4. The frequency divider according to claim 1, wherein number k of total stages of each said pair of flip-flops and a select signal SEL of the odd/even selector have following relationship:

$$N/(N+0.5)=(2 \cdot k-1 \cdot \text{SEL})/(2 \cdot k-1 \cdot \text{SEL}+0.5)$$

wherein the input clock is selected for controlling the frequency-dividing selector to realize even integer-N/(N+0.5) frequency division when the select signal SEL is logic "0"; otherwise the inverted input clock is selected for controlling the frequency-dividing selector to realize odd integer-N/(N+0.5) frequency division when the select signal SEL is logic "1".

5. The frequency divider according to claim 1, wherein the modulus logic circuit includes a NAND logic gate.

6. The frequency divider according to claim 1, wherein the modulus logic circuit further receives output of the modulus selector.

7. A frequency divider, comprising:
    two pairs of flip-flops respectively triggered by an input clock and an inverted input clock, each said pair having one or a plurality of connected flip-flops;
    a frequency-dividing selector for selecting one output of the two pairs of flip-flops as frequency-divided output signal;
    two latches respectively triggered by the input clock and the inverted input clock;
    a modulus selector for selecting one output of the two latches;
    a modulus logic circuit for determining being in either N frequency-dividing mode or (N+0.5) frequency-dividing mode based on a modulus control signal, N being an integer;
    a frequency-dividing logic circuit for receiving output of the modulus logic circuit and an inverted frequency-divided output signal, said frequency-dividing logic circuit swallowing half the input clock per output cycle of the frequency-divided output signal in the (N+0.5) frequency-dividing mode, therefore obtaining division resolution of half the input clock;
    at least one frequency-dividing circuit connected to the frequency-divided output signal; and
    a logic circuit for passing the modulus control signal to the modulus logic circuit when a specific output of the frequency-dividing circuit has been met.

8. The frequency divider according to claim 7, wherein the frequency-dividing circuit is a low speed frequency-dividing circuit triggered by a speed lower than speed of the flip-flops.

9. The frequency divider according to claim 7, wherein the frequency-dividing circuit includes a flip-flop.

10. The frequency divider according to claim 7, wherein the logic circuit comprises:
    a first AND logic gate for receiving output or outputs of said at least one frequency-dividing circuit; and
    a second AND logic gate for receiving output of the first AND logic gate and the modulus control signal.

11. The frequency divider according to claim 7, further comprising:
    an odd/even selector for selecting either the input clock or the inverted input clock to control the frequency-dividing selector.

12. The frequency divider according to claim 7, wherein the modulus logic circuit further receives output of the modulus selector.

13. A frequency divider, comprising:
    two pairs of flip-flops respectively triggered by an input clock and an inverted input clock, each said pair having n indirectly connected flip-flops;
    a frequency-dividing selector for selecting one output of the two pairs of flip-flops as frequency-divided output signal;
    two latches respectively triggered by the input clock and the inverted input clock;
    a modulus selector for selecting one output of the two latches;
    a modulus logic circuit for determining being in either N frequency-dividing mode or (N+0.5) frequency-dividing mode based on a modulus control signal, N being an integer;
    a frequency-dividing logic circuit for receiving output of the modulus logic circuit and an inverted frequency-divided output signal, said frequency-dividing logic circuit swallowing half the input clock per output cycle of the frequency-divided output signal in the (N+0.5) frequency-dividing mode, therefore obtaining division resolution of half the input clock; and n programmable selectors for connecting the flip-flops of each pair of flip-flops, wherein the m-th programmable selector is directly connected between the (m+1)-th flip-flop and the (m+2)-th flip-flop, m being 1 through (n−2), such that the m-th programmable selector receives output of the (m+1)-th flip-flop, and receives output of the m-th flip-flop, followed by connecting output of the m-th programmable selector to input of the (m+2)-th flip-flop, while the (n−1)-th programmable selector receives outputs of the n-th flip-flop and the (n−1)-th flip-flop, and output of the (n−1)-th programmable selector is connected to input of the frequency-dividing selector, n being a positive integer.

14. The frequency divider according to claim 13, further comprising:

an odd/even selector for selecting either the input clock or the inverted input clock to control the frequency-dividing selector.

15. The frequency divider according to claim 14, wherein respective select signals sel_1, sel_2, . . . , sel_n−1 of the programmable selectors, select signal SEL of the odd/even selector, the modulus control signal MOD, and the frequency division ratios N/(N+0.5) have following relationship:

| Division ratio | sel_1 | sel_2 | ... | sel_n − 1 | SEL | MOD |
|---|---|---|---|---|---|---|
| 1 | 1 | 1 | | 1 | 1 | 0 |
| 1.5 | 1 | 1 | | 1 | 1 | 1 |
| 2 | 0 | 1 | | 1 | 0 | 0 |
| 2.5 | 0 | 1 | | 1 | 0 | 1 |
| ... | | | | | | |
| N | 0 | 0 | | 0 | 1/0 | 0 |
| N + 0.5 | 0 | 0 | | 0 | 1/0 | 1 | where the select signal SEL of the odd/even selector is logic "1" when odd N is required, otherwise the select signal SEL is logic "0" when even N is required; the modulus control signal MOD is logic "0" when integer frequency division is required, otherwise the modulus control signal MOD is logic "1" when fractional frequency division is required.

16. The frequency divider according to claim 13, wherein the modulus logic circuit further receives output of the modulus selector.

* * * * *